United States Patent
Manning

(10) Patent No.: US 6,483,757 B2
(45) Date of Patent: *Nov. 19, 2002

(54) DELAY-LOCKED LOOP WITH BINARY-COUPLED CAPACITOR

(75) Inventor: Troy A. Manning, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/895,503

(22) Filed: Jun. 29, 2001

(65) Prior Publication Data

US 2002/0008556 A1 Jan. 24, 2002

Related U.S. Application Data

(60) Continuation of application No. 09/570,242, filed on May 12, 2000, now Pat. No. 6,256,259, which is a division of application No. 09/353,571, filed on Jul. 15, 1999, now Pat. No. 6,400,641, which is a division of application No. 08/811,918, filed on Mar. 5, 1997, now Pat. No. 5,946,244.

(51) Int. Cl.$^7$ .................................................. G11C 7/00
(52) U.S. Cl. ........................ 365/194; 365/233; 327/149
(58) Field of Search ................................ 365/194, 233; 327/149

(56) References Cited

U.S. PATENT DOCUMENTS

| | | | |
|---|---|---|---|
| 3,633,174 A | 1/1972 | Griffin ..................... | 340/172.5 |
| 4,004,100 A | 1/1977 | Takimoto ................ | 179/15 BS |
| 4,077,016 A | 2/1978 | Sanders et al. ............ | 331/4 |
| 4,096,402 A | 6/1978 | Schroeder et al. ......... | 307/362 |
| 4,404,474 A | 9/1983 | Dingwall .................. | 307/260 |
| 4,481,625 A | 11/1984 | Roberts et al. ............ | 370/85 |
| 4,508,983 A | 4/1985 | Allgood et al. ............ | 307/577 |
| 4,511,846 A | 4/1985 | Nagy et al. ............... | 328/164 |
| 4,514,647 A | 4/1985 | Shoji ....................... | 307/269 |

(List continued on next page.)

FOREIGN PATENT DOCUMENTS

| | | |
|---|---|---|
| EP | 0 171 720 A2 | 2/1986 |
| EP | 0 295 515 A1 | 12/1988 |
| EP | 0 406 786 A1 | 1/1991 |
| EP | 0 450 871 A2 | 10/1991 |
| EP | 0 476 585 A3 | 3/1992 |

(List continued on next page.)

OTHER PUBLICATIONS

Alvarez, J. et al. "A Wide–Bandwidth Low Voltage PLL for PowerPC™ Microprocessors" IEEE IEICE Trans. Electron., vol. E–78, No. 6, Jun. 1995, pp. 631–639.

(List continued on next page.)

*Primary Examiner*—Huan Hoang
(74) *Attorney, Agent, or Firm*—Dorsey & Whitney LLP

(57) ABSTRACT

A delay-locked loop incorporates binary-coupled capacitors in a capacitor bank to produce a variable capacitance along a delay line. The variable capacitance allows a delay of the variable delay line to be varied. In response to an input clock signal, the variable delay line produces a delayed output clock signal that is compared at a race detection circuit to the input clock signal. If the delayed clock signal leads the input clock signal, the race detection circuit increments a counter that controls the binary-coupled capacitors. The incremented counter increases the capacitance by coupling additional capacitance to the variable delay line to delay propagation of the delayed clock signal. If the delayed clock signal lags the original clock signal, the race detection circuit decrements the counter to decrease the capacitance, thereby decreasing the delay of the variable delay line. The race detection circuit includes an arbitration circuit that detects when the delayed clock signal and the variable clock signal are substantially synchronized and disables incrementing or decrementing of the counter in response.

14 Claims, 8 Drawing Sheets

U.S. PATENT DOCUMENTS

| | | |
|---|---|---|
| 4,524,448 A | 6/1985 | Hullwegen ................... 375/118 |
| 4,573,017 A | 2/1986 | Levine ........................ 327/114 |
| 4,600,895 A | 7/1986 | Landsman ................. 331/1 A |
| 4,603,320 A | 7/1986 | Farago ........................ 341/89 |
| 4,638,187 A | 1/1987 | Boler et al. ................. 307/451 |
| 4,638,451 A | 1/1987 | Hester et al. ............... 395/889 |
| 4,687,951 A | 8/1987 | McElroy ..................... 307/269 |
| 4,727,541 A | 2/1988 | Mori et al. .................. 370/112 |
| 4,773,085 A | 9/1988 | Cordell ....................... 375/120 |
| 4,789,796 A | 12/1988 | Foss ............................ 307/443 |
| 4,818,995 A | 4/1989 | Takahashi et al. ............ 341/94 |
| 4,893,087 A | 1/1990 | Davis .......................... 328/14 |
| 4,902,986 A | 2/1990 | Lesmeister .................. 331/25 |
| 4,953,128 A | 8/1990 | Kawai et al. ............... 365/194 |
| 4,958,088 A | 9/1990 | Farah-Bakhsh et al. ..... 307/443 |
| 4,972,470 A | 11/1990 | Farago ........................ 380/3 |
| 4,984,204 A | 1/1991 | Sato et al. ............. 365/189.11 |
| 5,020,023 A | 5/1991 | Smith ......................... 364/900 |
| 5,038,115 A | 8/1991 | Myers et al. ................. 331/2 |
| 5,075,569 A | 12/1991 | Branson ...................... 327/407 |
| 5,086,500 A | 2/1992 | Greub ......................... 395/500 |
| 5,087,828 A | 2/1992 | Sato et al. ................... 307/269 |
| 5,122,690 A | 6/1992 | Bianchi ....................... 307/475 |
| 5,128,560 A | 7/1992 | Chern et al. ................. 307/475 |
| 5,128,563 A | 7/1992 | Hush et al. .................. 307/482 |
| 5,134,311 A | 7/1992 | Biber et al. .................. 307/270 |
| 5,150,186 A | 9/1992 | Pinney et al. ................. 357/42 |
| 5,165,046 A | 11/1992 | Hesson ....................... 307/270 |
| 5,179,298 A | 1/1993 | Hirano et al. ................ 307/443 |
| 5,194,765 A | 3/1993 | Dunlop et al. ............... 307/443 |
| 5,212,601 A | 5/1993 | Wilson ........................ 360/51 |
| 5,220,208 A | 6/1993 | Schenck ...................... 307/443 |
| 5,223,755 A | 6/1993 | Richley ....................... 307/603 |
| 5,233,314 A | 8/1993 | McDermott et al. ........... 331/17 |
| 5,233,564 A | 8/1993 | Ohshima et al. ........ 365/230.05 |
| 5,239,206 A | 8/1993 | Yanai ....................... 307/272.2 |
| 5,243,703 A | 9/1993 | Farmwald et al. ........... 395/325 |
| 5,254,883 A | 10/1993 | Horowitz et al. ............ 307/443 |
| 5,256,989 A | 10/1993 | Parker et al. ............... 331/1 A |
| 5,257,294 A | 10/1993 | Pinto et al. .................. 375/120 |
| 5,268,639 A | 12/1993 | Gasbarro et al. ........ 324/158 R |
| 5,272,729 A | 12/1993 | Bechade et al. ............. 375/118 |
| 5,274,276 A | 12/1993 | Casper et al. ................ 307/443 |
| 5,276,642 A | 1/1994 | Lee ....................... 365/189.04 |
| 5,278,460 A | 1/1994 | Casper .................... 307/296.5 |
| 5,281,865 A | 1/1994 | Yamashita et al. .......... 307/279 |
| 5,283,631 A | 2/1994 | Koerner et al. .............. 307/451 |
| 5,289,580 A | 2/1994 | Latif et al. ................... 395/883 |
| 5,295,164 A | 3/1994 | Yamamura ................... 375/120 |
| 5,304,952 A | 4/1994 | Quiet et al. .................. 331/1 A |
| 5,311,481 A | 5/1994 | Casper et al. .......... 365/230.06 |
| 5,311,483 A | 5/1994 | Takasugi ..................... 365/233 |
| 5,313,431 A | 5/1994 | Uruma et al. .......... 365/230.05 |
| 5,315,388 A | 5/1994 | Shen et al. .................. 348/718 |
| 5,321,368 A | 6/1994 | Hoelzle ........................ 328/63 |
| 5,337,285 A | 8/1994 | Ware et al. .................. 365/227 |
| 5,341,405 A | 8/1994 | Mallard, Jr. ................. 375/120 |
| 5,347,177 A | 9/1994 | Lipp ............................ 307/443 |
| 5,347,179 A | 9/1994 | Casper et al. ................ 307/451 |
| 5,355,391 A | 10/1994 | Horowitz et al. ............. 375/36 |
| 5,361,002 A | 11/1994 | Casper ........................ 327/530 |
| 5,367,649 A | 11/1994 | Cedar ......................... 395/384 |
| 5,379,299 A | 1/1995 | Schwartz ..................... 370/108 |
| 5,390,308 A | 2/1995 | Ware et al. .................. 395/400 |
| 5,400,283 A | 3/1995 | Raad ........................... 365/203 |
| 5,402,389 A | 3/1995 | Flannagan et al. .......... 365/233 |
| 5,408,640 A | 4/1995 | MacIntyre et al. .......... 395/550 |
| 5,410,263 A | 4/1995 | Waizman ..................... 327/141 |
| 5,416,436 A | 5/1995 | Rainard ...................... 327/270 |
| 5,416,909 A | 5/1995 | Long et al. .................. 395/856 |
| 5,420,544 A | 5/1995 | Ishibashi ..................... 331/11 |
| 5,428,311 A | 6/1995 | McClure ...................... 327/276 |
| 5,428,317 A | 6/1995 | Sanchez et al. ............. 331/1 A |
| 5,430,408 A | 7/1995 | Ovens et al. ................ 327/407 |
| 5,430,676 A | 7/1995 | Ware et al. ............ 365/189.02 |
| 5,432,823 A | 7/1995 | Gasbarro et al. ............ 375/356 |
| 5,438,545 A | 8/1995 | Sim ........................ 365/189.05 |
| 5,440,260 A | 8/1995 | Hayashi et al. .............. 327/278 |
| 5,440,514 A | 8/1995 | Flannagan et al. .......... 365/194 |
| 5,444,667 A | 8/1995 | Obara ......................... 365/194 |
| 5,446,696 A | 8/1995 | Ware et al. .................. 365/222 |
| 5,448,193 A | 9/1995 | Baumert et al. ............. 327/156 |
| 5,451,898 A | 9/1995 | Johnson ...................... 327/563 |
| 5,457,407 A | 10/1995 | Shu et al. ..................... 326/30 |
| 5,465,076 A | 11/1995 | Yamauchi et al. ........... 331/179 |
| 5,473,274 A | 12/1995 | Reilly et al. ................. 327/159 |
| 5,473,575 A | 12/1995 | Farmwald et al. ...... 365/230.06 |
| 5,473,639 A | 12/1995 | Lee et al. .................... 375/376 |
| 5,485,490 A | 1/1996 | Leung et al. ................ 375/371 |
| 5,488,321 A | 1/1996 | Johnson ........................ 327/66 |
| 5,489,864 A | 2/1996 | Ashuri ........................ 327/161 |
| 5,497,127 A | 3/1996 | Sauer ........................... 331/17 |
| 5,498,990 A | 3/1996 | Leung et al. ................ 327/323 |
| 5,500,808 A | 3/1996 | Wang ..................... 365/189.05 |
| 5,502,672 A * | 3/1996 | Kwon .................... 365/189.05 |
| 5,506,814 A | 4/1996 | Hush et al. ............. 365/230.03 |
| 5,508,638 A | 4/1996 | Cowles et al. ................ 326/38 |
| 5,513,327 A | 4/1996 | Farmwald et al. ........... 395/309 |
| 5,532,714 A | 7/1996 | Knapp et al. ................ 345/114 |
| 5,539,345 A | 7/1996 | Hawkins ..................... 327/150 |
| 5,544,124 A | 8/1996 | Zagar et al. ............ 365/230.08 |
| 5,544,203 A | 8/1996 | Casasanta et al. ........... 375/376 |
| 5,552,727 A | 9/1996 | Nakao ......................... 327/159 |
| 5,555,429 A | 9/1996 | Parkinson et al. ...... 395/800.14 |
| 5,557,224 A | 9/1996 | Wright et al. ................ 327/115 |
| 5,557,781 A | 9/1996 | Stones et al. ................ 395/550 |
| 5,563,546 A | 10/1996 | Tsukada ...................... 327/407 |
| 5,568,075 A | 10/1996 | Curran et al. ............... 327/172 |
| 5,568,077 A | 10/1996 | Sato et al. ................... 327/199 |
| 5,572,557 A | 11/1996 | Aoki ........................... 375/376 |
| 5,572,722 A | 11/1996 | Vogley ........................ 395/555 |
| 5,574,698 A | 11/1996 | Raad ...................... 365/230.06 |
| 5,576,645 A | 11/1996 | Farwell ........................ 327/94 |
| 5,577,236 A | 11/1996 | Johnson et al. .............. 395/551 |
| 5,578,940 A | 11/1996 | Dillon et al. .................. 326/30 |
| 5,578,941 A | 11/1996 | Sher et al. ..................... 326/34 |
| 5,579,326 A | 11/1996 | McClure ....................... 371/61 |
| 5,581,197 A | 12/1996 | Motley et al. ................. 326/30 |
| 5,589,788 A | 12/1996 | Goto ........................... 327/276 |
| 5,590,073 A | 12/1996 | Arakawa et al. ....... 365/185.08 |
| 5,594,690 A | 1/1997 | Rothenberger et al. 365/189.01 |
| 5,614,855 A | 3/1997 | Lee et al. .................... 327/158 |
| 5,619,473 A | 4/1997 | Hotta ........................ 365/238.5 |
| 5,621,340 A | 4/1997 | Lee et al. ...................... 327/65 |
| 5,621,690 A | 4/1997 | Jungroth et al. ............. 365/200 |
| 5,621,739 A | 4/1997 | Sine et al. ................... 371/22.1 |
| 5,627,780 A | 5/1997 | Malhi ..................... 365/185.09 |
| 5,627,791 A | 5/1997 | Wright et al. ................ 365/222 |
| 5,631,872 A | 5/1997 | Naritake et al. ............. 365/227 |
| 5,636,163 A | 6/1997 | Furutani et al. ........ 365/189.01 |
| 5,636,173 A | 6/1997 | Schaefer ................. 365/230.03 |
| 5,636,174 A | 6/1997 | Rao ........................ 365/230.03 |
| 5,638,335 A | 6/1997 | Akiyama et al. ....... 365/230.03 |
| 5,646,904 A | 7/1997 | Ohno et al. .................. 365/233 |
| 5,657,289 A | 8/1997 | Hush et al. ............. 365/230.05 |
| 5,657,481 A | 8/1997 | Farmwald et al. ........... 395/551 |
| 5,663,921 A | 9/1997 | Pascucci et al. ............. 365/233 |
| 5,666,322 A | 9/1997 | Conkle ........................ 365/233 |
| 5,668,763 A | 9/1997 | Fujioka et al. ............... 365/200 |
| 5,668,774 A | 9/1997 | Furutani ...................... 365/233 |
| 5,675,274 A | 10/1997 | Kobayashi et al. .......... 327/158 |

| | | |
|---|---|---|
| 5,675,588 A | 10/1997 | Maruyama et al. ......... 371/20.4 |
| 5,692,165 A | 11/1997 | Jeddeloh et al. ............ 395/551 |
| 5,694,065 A | 12/1997 | Hamasaki et al. .......... 327/108 |
| 5,708,611 A | 1/1998 | Iwamoto ................. 365/233 X |
| 5,712,580 A | 1/1998 | Baumgartner et al. ........ 327/12 |
| 5,719,508 A | 2/1998 | Daly ........................... 327/12 |
| 5,737,342 A | 4/1998 | Ziperovich ................ 371/25.1 |
| 5,740,123 A | 4/1998 | Uchida ........................ 365/233 |
| 5,751,665 A | 5/1998 | Tanoi .......................... 368/120 |
| 5,767,715 A | 6/1998 | Marquis et al. ............. 365/233 |
| 5,768,177 A | 6/1998 | Sakuragi ..................... 365/194 |
| 5,774,699 A | 6/1998 | Nagae ......................... 395/551 |
| 5,778,214 A | 7/1998 | Taya et al. .................. 395/551 |
| 5,781,499 A | 7/1998 | Koshikawa ................. 365/233 |
| 5,784,422 A | 7/1998 | Heermann .................. 375/355 |
| 5,789,947 A | 8/1998 | Sato ............................... 327/3 |
| 5,790,612 A | 8/1998 | Chengson et al. .......... 375/373 |
| 5,794,020 A | 8/1998 | Tanaka et al. ............... 395/552 |
| 5,805,931 A | 9/1998 | Morzano et al. .............. 710/64 |
| 5,812,619 A | 9/1998 | Runaldue .................... 375/376 |
| 5,822,314 A | 10/1998 | Chater-Lea ................. 370/337 |
| 5,831,929 A | 11/1998 | Manning ..................... 365/233 |
| 5,841,707 A | 11/1998 | Cline et al. .................. 365/194 |
| 5,852,378 A | 12/1998 | Keeth .......................... 327/171 |
| 5,872,959 A | 2/1999 | Nguyen ....................... 395/552 |
| 5,889,829 A | 3/1999 | Chia et al. ................... 375/376 |
| 5,898,242 A | 4/1999 | Peterson ..................... 327/278 |
| 5,898,674 A | 4/1999 | Mawhinney et al. ........ 370/247 |
| 5,917,760 A | 6/1999 | Millar .......................... 365/194 |
| 5,920,518 A | 7/1999 | Harrison et al. ............. 365/233 |
| 5,926,047 A | 7/1999 | Harrison ...................... 327/159 |
| 5,926,436 A | 7/1999 | Toda et al. ................... 365/236 |
| 5,940,608 A | 8/1999 | Manning ..................... 395/551 |
| 5,940,609 A | 8/1999 | Harrison ...................... 395/559 |
| 5,946,244 A | 8/1999 | Manning ..................... 365/194 |
| 5,953,284 A | 9/1999 | Baker et al. ................. 365/233 |
| 5,964,884 A | 10/1999 | Partovi et al. ............... 713/503 |
| 5,990,719 A | 11/1999 | Dai et al. ..................... 327/244 |
| 6,005,823 A | 12/1999 | Martin et al. .......... 365/230.08 |
| 6,011,732 A | 1/2000 | Harrison et al. ............. 365/194 |
| 6,016,282 A | 1/2000 | Keeth .......................... 365/233 |
| 6,023,489 A | 2/2000 | Hatch .......................... 375/208 |
| 6,026,050 A | 2/2000 | Baker et al. ................. 635/233 |
| 6,029,250 A | 2/2000 | Keeth .......................... 713/400 |
| 6,038,219 A | 3/2000 | Mawhinney et al. ........ 370/242 |
| 6,067,592 A | 5/2000 | Farmwald et al. .......... 710/104 |
| 6,101,152 A | 8/2000 | Farmwald et al. .......... 365/233 |
| 6,101,197 A | 8/2000 | Keeth et al. ................. 370/517 |
| 6,105,157 A | 8/2000 | Miller ......................... 714/744 |
| 6,147,905 A | 11/2000 | Seino ..................... 365/185.11 |
| 6,147,916 A | 11/2000 | Ogura ......................... 365/203 |
| 6,160,423 A | 12/2000 | Haq .............................. 327/41 |
| 6,262,921 B1 * | 7/2001 | Manning ..................... 365/194 |

FOREIGN PATENT DOCUMENTS

| | | |
|---|---|---|
| EP | 0 655 741 A2 | 5/1995 |
| EP | 0 655 834 A1 | 5/1995 |
| EP | 0 680 049 A2 | 11/1995 |
| EP | 0 703 663 A1 | 3/1996 |
| EP | 0 704 848 A3 | 4/1996 |
| EP | 0 704 975 A1 | 4/1996 |
| EP | 0 767 538 A1 | 4/1997 |
| JP | 6-1237512 | 10/1986 |
| JP | 2-112317 | 4/1990 |
| JP | 4-135311 | 5/1992 |
| JP | 5-136664 | 6/1993 |
| JP | 5-282868 | 10/1993 |
| JP | WO 94/29871 | 12/1994 |
| JP | 0-7319577 | 12/1995 |
| WO | WO 95/22200 | 8/1995 |
| WO | WO 95/22206 | 8/1995 |
| WO | WO 96/10866 | 4/1996 |
| WO | WO 97/14289 | 4/1997 |
| WO | WO 97/42557 | 11/1997 |

OTHER PUBLICATIONS

Anonymous, "400MHz SLDRAM, 4M X 16 SLDRAM Pipelined, Eight Bank, 2.5 V Operation," SLDRAM Consortium Advance Sheet, published throughout the United States, pp. 1–22.

Anonymous, "Draft Standard for a High–Speed Memory Interface SyncLink)", Microprocessor and Microcomputer Standards Subcommittee of the IEEE Computer Society, Copyright 1996 by the Institute of Electrical and Electronics Engineers, Inc., New York, NY, pp. 1–56.

Anonymous, "Programmable Pulse Generator", IBM Technical Disclosure Bulletin, vol. 17, No. 12, May 1975, pp. 3553–3554.

Anonymous, "Pulse Combining Network", IBM Technical Disclosure Bulletin, vol. 32, No. 12, May 1990, pp. 149–151.

Anonymous, "Variable Delay Digital Circuit", IBM Technical Disclosure Bulletin, vol. 35, No. 4A, Sep. 1992, pp. 365–366.

Arai, Y. et al., "A CMOS Four Channel x1K Time Memory LSI with 1–ns/b Resolution", IEEE Journal of Solid–State Circuits, vol. 27, No. 3, M, 8107 Mar., 1992, No. 3, New Yorkm US, pp. 359–364 and pp. 528–531.

Arai, Y. et al., "A Time Digitizer CMOS Gate–Array with a 250 ps Time Resolution", XP 000597207, IEEE Journal of Solid–State Circuits, vol. 31, No. 2, Feb. 1996, pp. 212–220.

Bazes, M., "Two Novel Fully Complementary Self–Biased CMOS Differential Amplifiers", IEEE Journal of Solid–State Circuits, vol. 26, No. 2, Feb. 1991, pp. 165–168.

Chapman, J. et al., "A Low–Cost High–Performance CMOS Timing Vernier for ATE", IEEE International Test Conference, Paper 21.2, 1995, pp. 459–468.

Cho, J. "Digitally–Controlled PLL with Pulse Width Detection Mechanism for Error Correction", ISSCC 1997, Paper No. SA 20.3, pp. 334–335.

Christiansen, J., "An Integrated High Resolution CMOS Timing Generator Based on an Array of Delay Locked Loops", IEEE Journal of Solid–State Circuits, vol. 31, No. 7, Jul. 1996, pp. 952–957.

Combes, M. et al., "A Portable Clock Multiplier Generator Using Digital CMOS Standard Cells", IEEE Journal of Solid–State Circuits, vol. 31, No. 7, Jul. 1996, pp. 958–965.

Donnelly, K. et al., "A 660 MB/s Interface Megacell Portable Circuit in 0.3 $\mu$m–0.7 $\mu$m CMOS ASIC", IEEE Journal of Solid–State Circuits, vol. 31, No. 12, Dec. 1996, pp. 1995–2001.

Goto, J. et al., "A PLL–Based Programmable Clock Generator with 50–to 350–MHz Oscillating Range for Video Signal Processors", IEICE Trans. Electron., vol. E77–C, No. 12, Dec. 1994, pp. 1951–1956.

Gustavsion, David B., et al., "IEEE Standard for Scalable Coherent Interface (SCI)," IEEE Computer Society, IEEE Std. 1596–1992, Aug. 2, 1993.

Hamamoto, T., "400–MHz Random Column Operating SDRAM Techniques with Self–Skew Compensation", IEEE Journal of Solid–State Circuits, vol. 33, No. 5, May 1998, pp. 770–778.

Ishibashi, A. et al., "High–Speed Clock Distribution Architecture Employing PLL for 0.6μm CMOS SOG", IEEE Custom Integrated Circuits Conference, 1992, pp. 27.6.1–27.6.4.

Kikuchi, S. et al., "A Gate–Array–Based 666MHz VLSI Test System", IEEE International Test Conference, Paper 21.1, 1995, pp. 451–458.

Kim, B. et al., "A 30MHz High–Speed Analog/Digital PLL in 2μm CMOS", ISSCC, Feb. 1990.

Ko, U. et al., "A 30–ps Jitter, 3.6–μs Locking, 3.3–Volt Digital PLL for CMOS Gate Arrays", IEEE Custom Integrated Circuits Conference, 1993, pp. 23.3.1–23.3.4.

Lee, T. et al., "A 2.5V Delay–Locked Loop for an 18Mb 500MB/s DRAM", IEEE International Solid–State Circuits Conference Digest of Technical Papers, Paper No. FA 18.6, 1994, pp. 300–301.

Lesmeister, G., "A Densely Integrated High Performance CMOS Tester", International Test Conference, Paper 16.2, 1991, pp. 426–429.

Ljuslin, C. et al., "An Integrated 16–channel CMOS Time to Digital Converter", IEEE Nuclear Science Symposium & Medical Imaging Conference Record, vol. 1, 1993, pp. 625–629.

Maneatis, J., "Low–Jitter Process–Independent DLL and PLL Based on Self–Biased Techniques", IEEE Journal of Soldid–State Circuits, vol. 31, No. 11, Nov. 1996, pp. 1723–1732.

Nakamura, M. et al., "A 156 Mbps CMOS Clock Recovery Circuit for Burst–mode Transmission", Symposium on VLSI Circuits Digest of Technical Papers, 1996, pp. 122–123.

Nielson, E., "Inverting latches make simple VCO", EDN, Jun. 19, 1997.

Novof, I. et al., "Fully Integrated CMOS Phase–Locked Loop with 15 to 240 MHz Locking Range and ±50 ps Jitter", IEEE Journal of Solid–State Circuits, vol. 30, No. 11, Nov. 1995, pp. 1259–1266.

Saeki, T. et al., "A 2.5–ns Clock Access, 250–MHz, 256–Mb SDRAM with Synchronous Mirror Delay", IEEE Journal of Solid–State Circuits, vol. 31, No. 11, Nov. 1996, pp. 1656–1665.

Santos, D. et al., "A CMOS Delay Locked Loop And Sub–Nanosecond Time–to–Digital Converter Chip", IEEE Nuclear Science Symposium and Medical Imaging Conference Record, vol. 1, Oct. 1995, pp. 289–291.

Shirotori, T. et al., "PLL–based, Impedance Controlled Output Buffer", 1991 Symposium on VLSI Circuits Digest of Technical Papers, pp. 49–50.

Sidiropoulos, S. et al., "A 700–Mb/s/pin CMOS Signaling Interface Using Current Integrating Receivers", IEEE Journal of Solid–State Circuits, vol. 32, No. 5, May 1997, pp. 681–690.

Sidiropoulos, S. et al., "A CMOS 500 Mbps/pin synchronous point to point link interface", IEEE Symposium on VLSI Circuits Digest of Technical Papers, 1994, pp. 43–44.

Sidiropoulos, S. et al., "A Semi–Digital DLL with Unlimited Phase Shift Capability and 0.08–400MHz Operating Range," IEEE International Solid State Circuits Conference, Feb. 8, 1997, pp. 332–333.

Soyuer, M. et al., "A Fully Monolithic 1.25GHz CMOS Frequency Synthesizer", IEEE Symposium on VLSI Circuits Digest of Technical Papers, 1994, pp. 127–128.

Taguchi, M. et al., "A 40–ns 64–Mb DRAM with 64–b Parallel Data Bus Architecture", IEEE Journal of Solid–State Circuits, vol. 26, No. 11, Nov. 1991, pp. 1493–1497.

Tanoi, S. et al., "A 250–622 MHz Deskew and Jitter–Suppressed Clock Buffer Using a Frequency–and Delay–Locked Two–Loop Architecture", 1995 Symposium on VLSI Circuits Digest of Technical Papers, vol. 11, No. 2, pp. 85–86.

Tanoi, S. et al., "A 250–622 MHz Deskew and Jitter–Suppressed Clock Buffer Using Two–Loop Architecture", IEEE IEICE Trans. Electron., vol. E–79–C. no. 7, Jul. 1996, pp. 898–904.

von Kaenel, V. et al., "A 320 MHz, 1.5mW @ 1.35 V CMOS PLL for Microprocessor Clock Generation", IEEE Journal of Solid–State Circuits, vol. 31, No. 11, Nov. 1996, pp. 1715–1722.

Watson, R. et al., "Clock Buffer Chip with Absolute Delay Regulation Over Process and Environmental Variations", IEEE Custom Integrated Circuits Conference, 1992, pp. 25.2.1–25.2.5.

Yoshimura, T. et al. "A 622–Mb/s Bit/Frame Synchronizer for High–Speed Backplane Data Communication", IEEE Journal of Solid–State Circuits, vol. 31, No. 7, Jul. 1996, pp. 1063–1066.

* cited by examiner

DELAY-LOCKED LOOP WITH BINARY-COUPLED CAPACITOR

CROSS-REFERENCE TO RELATED APPLICATIONS

This application is a continuation of pending U.S. patent application Ser. No. 09/570,242, filed May 12, 2000, now U.S. Pat. No. 6,256,259 which is a divisional of U.S. patent application Ser. No. 09/353,571, filed Jul. 15, 1999, now U.S. Pat. No. 6,400,641, which is a divisional of U.S. patent application Ser. No. 08/811,918, filed Mar. 5, 1997, issued Aug. 31, 1999 as U.S. Pat. No. 5,946,244.

TECHNICAL FIELD

The present invention relates to integrated circuit devices, and more particularly, to delay-locked loop circuits in integrated circuit devices.

BACKGROUND OF THE INVENTION

Many high-speed integrated devices, such as a synchronous memory device 40 shown in FIG. 1, perform operations in a predetermined sequence. These operations are generally performed responsive to respective command signals issued by a command generator, such as a memory controller 44.

It will be understood by one skilled in the art that the block diagram of FIG. 1 omits some signals applied to the memory device 40 for purposes of brevity. Also, one skilled in the art will understand that the command signals COM may be composed of a combination of other signals or may be a packet of control data. In either case, the combination of signals or packet is commonly referred to as simply a command. The exact nature of these signals or packet will depend on the nature of the memory device 40, but the principles explained above are applicable to many types of memory devices, including synchronous DRAMs and packetized DRAMs. Also, although the timing control by issuing command signals according to a fixed relationship with the clock signal will be explained with reference to memory devices, the principles described herein are applicable to other integrated circuits that utilize counters or related switching signals responsive to a clock signal.

Timing of operations within the device 40 is determined by a logic control circuit 42 controlled by an internal clock signal CKBUF. In a synchronous DRAM, the logic control circuit 42 may be realized conventionally. In a packetized memory system, the logic control circuit may include command sequencing and decoding circuitry.

Timing of signals outside of the memory device 40 is determined by an external clock signal CKIN that is produced by an external device 44 such as a memory controller. Usually, operations within the memory device 40 must be synchronized to operations outside of the memory device 40. For example, commands and data are transferred into or out of the memory device 40 on command and data busses 48, 49, respectively, by clocking command and data latches 50, 52 according to the internal clock signal CKBUF. Command timing on the command bus 48 and data timing on the data bus 49 are controlled by the external clock signal CKIN. To transfer commands and data to and from the busses 48, 49 at the proper times relative to the external clock signal CKIN, the internal clock signal CKBUF must be synchronized to the external clock signal CKIN.

To ensure that the clock signals CKBUF, CKIN can be synchronized, the internal clock signal CKBUF is derived from the external clock signal CKIN. A buffer amplifier 46 buffers the external clock signal CKIN to produce a buffered version of the external clock signal CKIN as the internal clock signal CKBUF. The buffer amplifier 46 is a conventional differential amplifier that provides sufficient gain and appropriate level shifting so that the buffered clock signal CKBUF can drive circuits within the memory device 40 at CMOS levels.

The buffer amplifier 46 also induces some time delay so that the buffered clock signal CKBUF is phase-shifted relative the external clock signal CKIN. As long as the phase-shift is very minimal timing within the memory device 40 can be synchronized easily to the external timing.

Unfortunately, as the frequency of operation of the memory device 40 increases, the time delay induced by the buffer amplifier 46 may become significant. Consequently, commands or data supplied by the memory controller 44 may be gone from the command or data bus 48, 49 before the latches 50, 52 are activated on the appropriate edge of the buffered clock signal CKBUF. To prevent the latches 50, 52 from missing commands that arrive synchronously with the external clock CKIN, the memory device 40 may be operated at lower frequencies. However, lower frequency operation of memory devices typically reduces the speed of operation undesirably.

To improve synchronization of the internal and external timing, a prior art memory device 60 shown in FIG. 2 includes an analog delay-locked loop 62 that receives the buffered clock signal CKBUF and produces a synchronized clock signal CKSYNC that is synchronized to the external clock signal CKIN. To compensate for the delay of the buffer amplifier 46, the synchronized clock signal CKSYNC is phase-shifted relative to the buffered clock signal CKBUF by an amount offsetting the delay of the buffer amplifier 46. Because the synchronized clock signal CKSYNC is synchronized and substantially in phase with the external clock signal CKIN, commands and data arriving on the command bus 48 or data bus 49 can be synchronized to the external clock CKIN through the synchronous clock signal CKSYNC.

One problem with the memory device 60 of FIG. 2 is that conventional delay-locked loops 62 typically operate only over a narrow frequency band. Consequently, the memory device 60 may not operate properly in multifrequency environments or in a wide range of applications.

Mo reover, many conventional analog delaylocked loops include relatively sophisticated analog components that are not always easily integrated with digital memory components. Also, as operating conditions vary, the delay of the buffer amplifier 46 can vary, thereby causing corresponding variations in the phase shift. If the delay-locked loop 62 does not adjust the phase shift of the synchronous clock signal CKSYNC accordingly, operations within the device 40 may not remain properly synchronized to the external clock CKIN.

SUMMARY OF THE INVENTION

A delay-locked loop produces a plurality of phase shifted signals in response to an input signal at a selected input frequency. The delay-locked loop includes a variable delay circuit that outputs a delayed clock signal. A race detection circuit receives the delayed clock signal and the input clock signal and, depending upon whether the delayed clock signal leads or lags the input clock signal, the race detection circuit outputs an increment or decrement signal to a counter. In response to the increment or decrement signal, the counter increments or decrements a digital count signal.

The variable delay circuit includes a bank of selectable capacitors, each selectively coupled between a reference potential and a supply potential by a respective selection switch. Each of the selection switches is controlled by 1 bit of the digital count signal from the counter. If the corresponding bit is a "1," the selection switch couples the capacitor in parallel with the other capacitors. The capacitance of the bank is determined by the number and capacitance of the selected capacitors. Because the delay of the delay circuit corresponds to the capacitance, the delay of the delay circuit is controlled by the digital count signal.

Each capacitor in the bank has a capacitance corresponding to the significance of its respective bit of the digital count. For example, the capacitor controlled by the most significant bit of the digital signal is the largest capacitor and the capacitor controlled by the least significant bit of the digital signal is the smallest capacitor.

In one embodiment, the race detection circuit is formed from a pair of pulse generators, each having its output coupled to a respective gating circuit The gating circuits each include control ports and are responsive to control signals at the control ports to pass or block the pulse from the respective pulse circuit. The outputs of the gating circuits drive respective latch circuits. Each of the latch circuits includes an output coupled to control port of the gating circuit coupled to the other latch circuit so that the latches output the control signals. Thus, if a pulse passes through the first gating circuits and sets its corresponding latch, the latch output disables the second gating circuit and prevents the second latch from being set.

If both pulses arrive at their corresponding gating circuit substantially simultaneously, both of the latches are set before the gating circuits are disabled. In response to both latches being set, an arbitration circuit disables clocking of the counter so that the digital count signal remains constant, thereby maintaining the delay of the variable delay circuit.

DETAILED DESCRIPTION OF THE INVENTION

Figure 3:
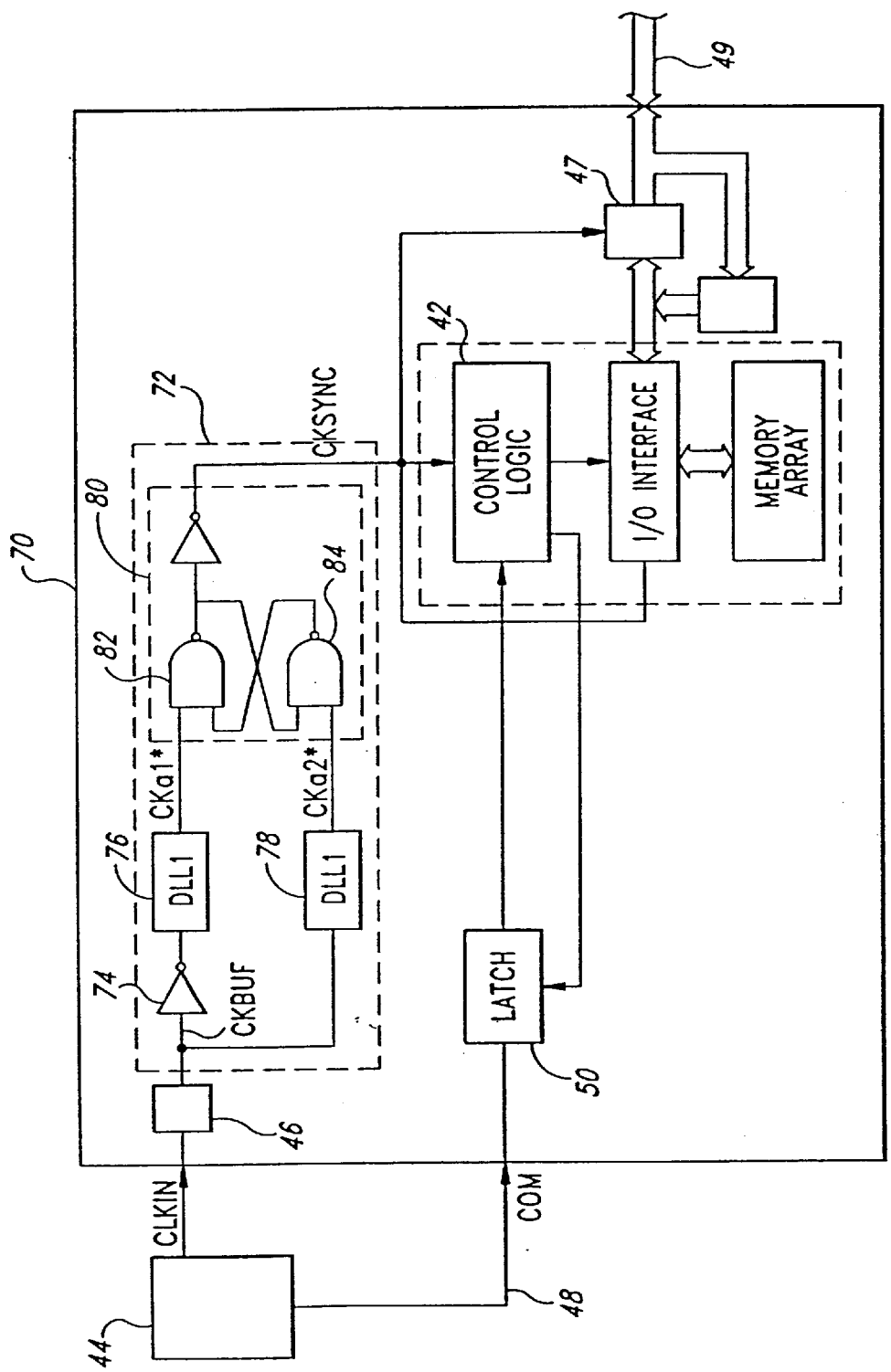
FIG. 3 is a block diagram of a memory device according to one embodiment of the invention under control of a memory controller and including a pair of digital delay-locked loops and a latch circuit that produce a synchronized internal clock signal.

As shown in FIG. 3, a memory device 70 according to one embodiment of the invention operates under control of the external clock signal CLKIN and commands COM from the external device 44. One skilled in the art will recognize that the commands COM are typically a composite of signals such as the row and column address strobes RAS*, CAS* or output enable signal OE*. Alternatively, the commands COM may be incorporated in a packet of control data in a packetized memory system.

Figure 1:
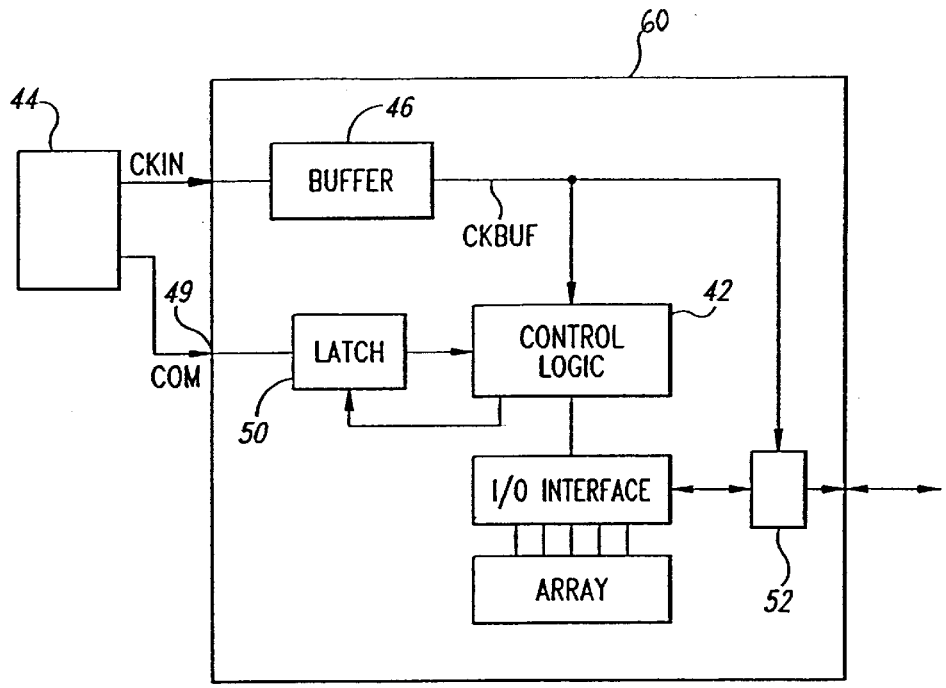
FIG. 1 is a block diagram of a prior art memory device driven by a memory controller and including a buffer amplifier producing a buffered clock signal.
Figure 2:
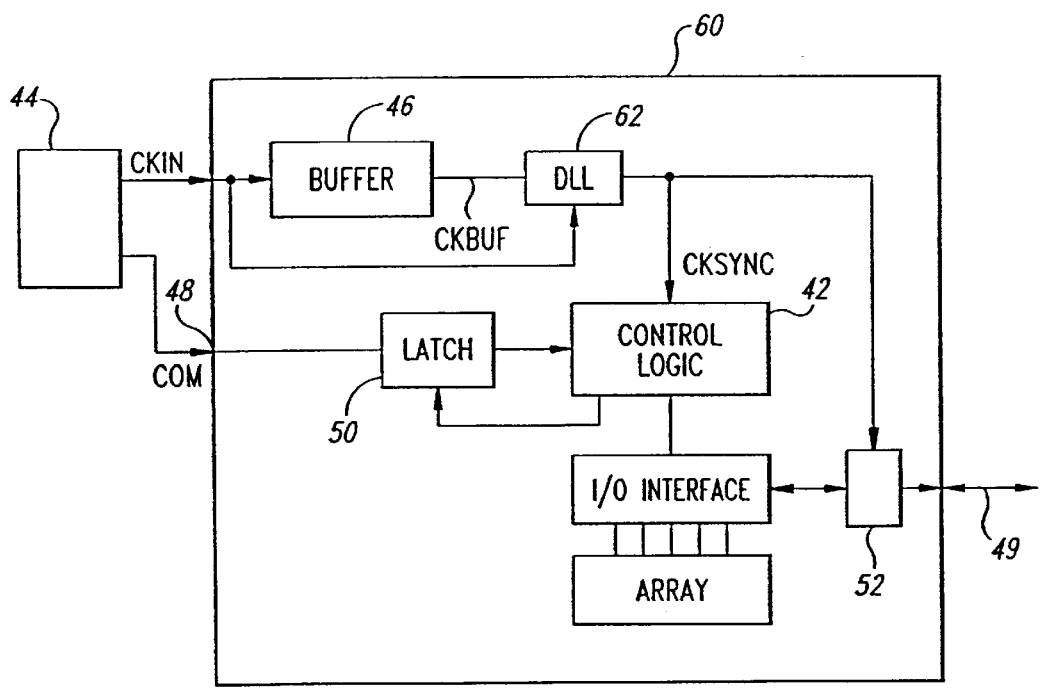
FIG. 2 is a block diagram of a prior art memory device driven by a memory controller and including a delay-locked loop that produces a synchronized clock signal from the buffered clock signal.
Figure 4:
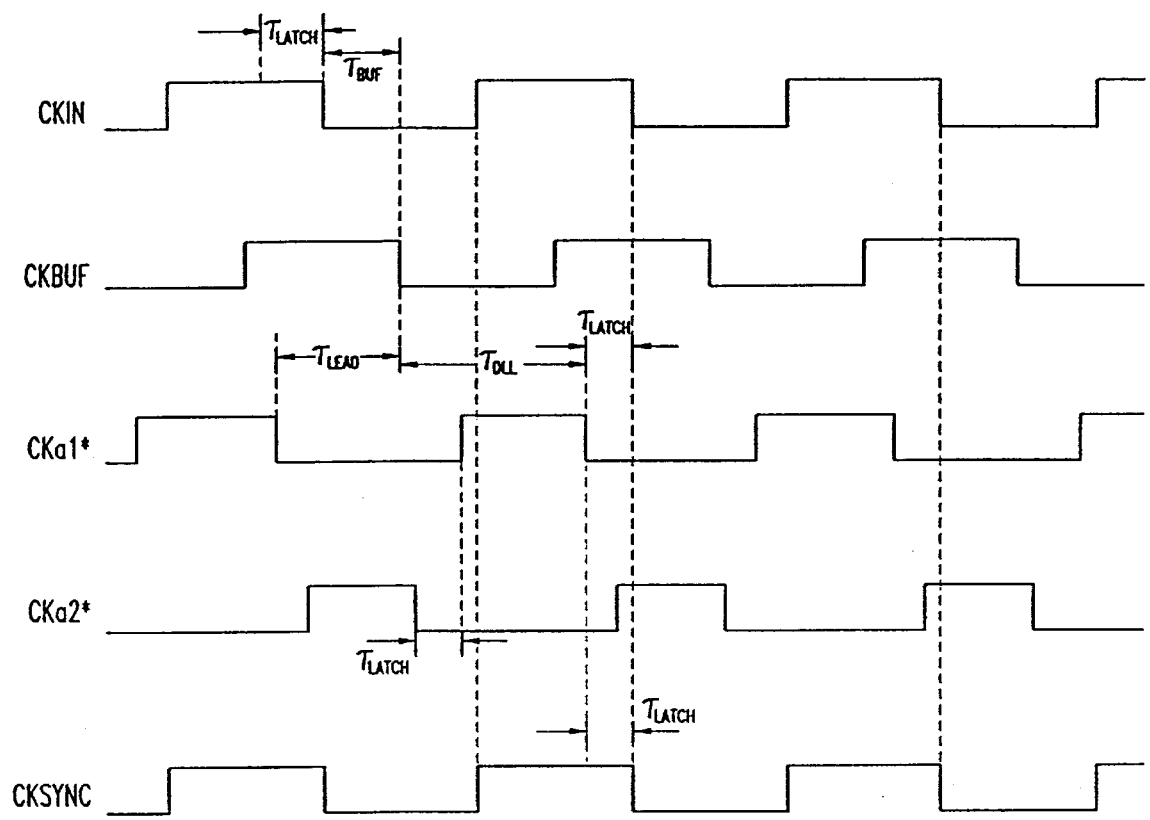
FIG. 4 is a signal timing diagram of selected signals within the memory device of FIG. 3.

The memory device 70 includes the logic control circuit 42 and buffer amplifier 46 as described above with reference to FIGS. 1 and 2. However, rather than the analog delay-locked loop 62 of the device 60 of FIG. 2, the memory device 70 includes a synchronous clock circuit 72 formed from an input inverter 74, first and second digital delay-locked loops 76, 78 and a latch circuit 80. Operation of the synchronous clock circuit 72 will now be explained with reference to FIGS. 4–6.

In response to the input clock signal CLKIN, the buffer amplifier 46 outputs a buffered clock signal CLKBUF that is delayed with respect to the input clock signal CLKIN by the response time $\tau_{BUF}$ of the buffer amplifier 46. The first delay-locked loop 76 receives an inverted version of the buffered clock signal CKBUF from the inverter 74 and the second delay-locked loop 78 receives the buffered clock signal CKBUF directly. As will be described below with reference to FIG. 5, the delay-locked loops 76, 78 are trailing-edge based delay-locked loops that produce a first delayed clock CKa1* as shown in the third graph of 4 in response to falling edge of the buffered clock signal CKBUF and a second delayed clock CKa2* as shown in the fourth graph of FIG. 4 in response to the falling edge of the inverted buffered clock signal CKBUF*. Consequently, the operations described below will be initiated at time $t_1$ by a falling edge of the external clock signal CKIN that causes a falling edge of the buffered clock signal CKBUF. As will also be described below, the delayed clock signals CKa1*, CKa2* are synchronized to the falling and rising edges, respectively, of buffered clock signal CKBUF. Each falling edge of the clock signals CKa1*, CKa2* leads the corresponding falling or rising edge of the buffered clock signal CKBUF by a time $\tau_{LEAD}$ that is substantially equal to the sum of the delay time $\tau_{BUF}$ of the buffer amplifier 46 and delay time $\tau_{LATCH}$ of the latch circuit 80. Thus, falling edges of the first delayed clock signal CKa1* lead falling edges the external clock signal CKIN by approximately the delay time of the latch circuit 80. Similarly, falling edges of the second delayed clock signal CKa2* lead rising edges of the external clock signal CKIN by the delay time of the latch circuit 80.

The latch circuit 80 receives the delayed clock signals CKa1*, CKa2* at inputs of respective NAND gates 82, 84. As will be explained below, the latch circuit 80 responds to falling edges of the first delayed clock signal CKa1* by producing a low-going edge of the synchronized clock signal CKSYNC. The latch circuit 80 responds to low-going edges of the second clock signal CKa2* by producing high-going edges of the synchronous clock signal CKSYNC. The rising and falling edges of synchronized clock signal CKSYNC lag the falling edges of the delayed clock signals CKa1*, CKa2* by the delay time $\tau_{LATCH}$ of the latch circuit 80, and the falling edges of the delayed clock signals CKa1*, CKa2* lead the external clock signal CKIN by the delay time $\tau_{LATCH}$ of the latch circuit 80. Therefore, the synchronous clock signal CKSYNC is substantially in phase with the external clock signal CKIN.

The logic control circuit 42 establishes timing of operations within the memory device 70 responsive to the synchronous clock signal CKSYNC. For example, the logic control circuit 42 activates the command latches 50 on edges of the synchronous clock signal CKSYNC to latch commands COM that arrive on the command bus 48 at edges of external clock signal CKIN, based upon the synchronous clock signal CKSYNC. Similarly, the logic control circuit 42 can activate the data latches 52 at a fixed phase relative to the external clock CLKIN. One skilled in the art will recognize from the following description that timing of signals in the delay-locked loop 76 is dictated principally by falling edges of the buffered clock signal CKBUF. For the delaylocked loop 78, the inverter 74 converts rising edges of the buffered clock signal CKBUF to falling edges of the inverter buffered clock signal CKBUF*. Therefore, the delay-locked loop 78 responds to falling edges of the inverted buffered clock signal CKBUF*. The delay-locked loops 76, 78 can be substantially identical, because timing in both delay-locked loops 76, 78 is controlled by falling edges. Therefore, only the first delay-locked loop 76 will be described in detail herein.

Figure 5:
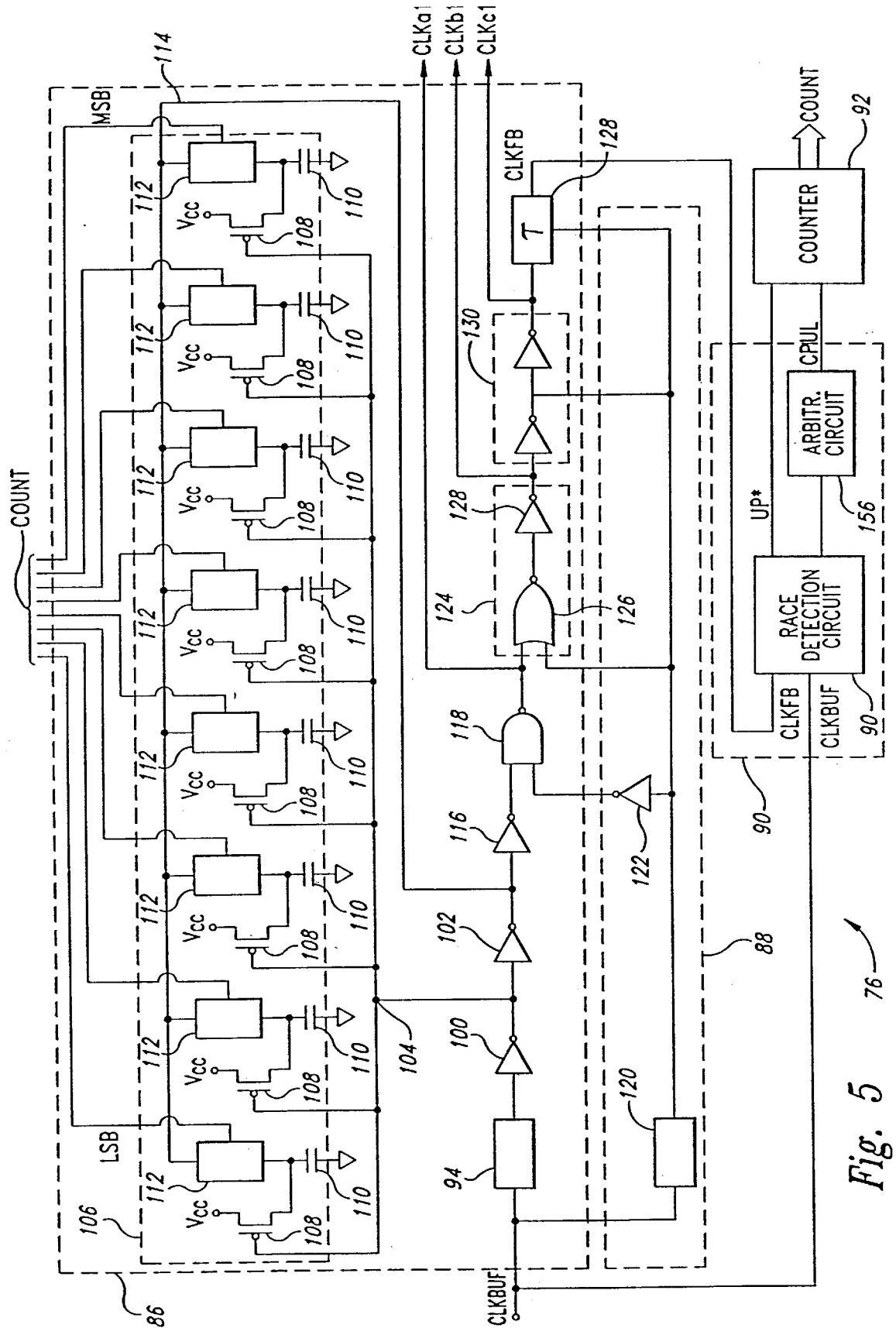
FIG. 5 is a schematic of one of the delay-locked loops of FIG. 3.

FIG. 5 shows the delay-locked loop 76 in greater detail. The delay-locked loop 76 is formed from a variable delay line 86, a preset circuit 88, a race detection circuit 90 and a counter 92. The variable delay line 86 forms the principal delay element of the delay-locked loop 76 and receives the buffered clock signal CLKBUF at a pulse generator 94. The pulse generator 94 is a conventional circuit that responds to the falling edge of the buffered clock signal CLKBUF at time $t_3$ with a very brief high-going pulse, on the order of 0.5 nS, as shown in the third graph of FIG. 6. One example of a suitable pulse generator 94 is shown in FIG. 7 where the pulse generator 94 is formed from a NAND gate 96 and inverters 98.

The output pulse from the pulse generator 94 begins at time 4, which is delayed slightly relative to the falling edge of the buffered clock signal CLKBUF at time $t_3$, due to the delay of the pulse generator 94. The output pulse from the pulse generator 94 drives a first inverter 100 to produce an inverted pulse at time $t_5$. The inverted pulse at time $t_5$ drives a second inverter 102 and also drives a precharge input 104 of a capacitor bank 106. The effect of the inverted pulse on the capacitor bank 106 will be described first.

When the inverted pulse arrives at the precharge input 104 at time $t_5$, the inverted pulse briefly turns ON a bank of PMOS transistors 108 coupled in series with respective capacitors 110 between a supply voltage $V_{cc}$ and ground. The ON PMOS transistors 108 provide current paths from the supply voltage $V_{cc}$ to their respective capacitors 110 to precharge the capacitors 110 toward the supply voltage $V_{cc}$ during the time the pulse is low. The capacitor voltages Vc are coupled by respective selection switches 112 to a common node 114 which is also connected to the output of the second inverter 102. In a manner to be described below with reference to FIG. 9, selected ones of the selection switches 112 are turned ON by respective bits of a count signal COUNT so that the voltages on the selected capacitors 110 are provided to the common node 114 by the ON selector switches.

Because the capacitors 110 are coupled in parallel the capacitance of the capacitor bank equals the sum of the capacitors coupled to the common node 114. The capacitance of the bank is thus controlled by the count signal COUNT. For example, if all of the bits of the count signal COUNT are high, all of the capacitors 110 are coupled to the common node 114 and the capacitance presented to the common node 114 equals the sum of all the capacitors' capacitances. To allow the capacitance to be varied in equal increments, each capacitor has a binarily weighted capacitance, where the weighting corresponding to the significant of the respective bit of the count signal COUNT. For example, the capacitor controlled by the most significant bit (far right) has twice the capacitance of the capacitor controlled by the second most significant bit. Likewise, the capacitor controlled by the least significant bit (far left) has half the capacitance of the capacitor controlled by the next least significant bit.

During a very brief period following time $t_5$ (i.e., before the second inverter 102 responds to the low transition from the first inverter), the ON PMOS transistors 108 charge the capacitors 110 while the second inverter 102 discharges the capacitors 110 through the common node 114. The PMOS transistor 108 have substantially more current capacity than the second inverter 102, so the common node voltage rises. At time $t_6$, which follows time $t_5$ only by the delay of the second inverter 102, the output of the second inverter 102 transitions high, thereby assisting the PMOS transistors 108 to quickly charge the capacitor voltages $V_c$ to the supply voltage $V_{cc}$ at time $t_6$. The rising edge of the pulse from the pulse generator 94 thus precharges the capacitors 110 to the supply voltage at time $t_6$.

The propagation of the leading edge of the pulse from the pulse generator 94 through the remaining portion of the variable delay line 86 does not affect the operation of the delay-locked loop 76, as can be seen from the following discussion. In response to the high voltage at the common node 114, a third inverter 116 applies a low to a NAND gate 118 at time $t_7$, as shown in the sixth graph of FIG. 6. The second input of the NAND gate 118 receives an inverted pulse from a reset pulse generator 120 and an inverter 122, as shown in the eighth graph of FIG. 6. The inverted pulse anives at the NAND gate 118 before the falling edge of the third inverter output and establishes a high NAND gate output. Thus, the falling edge of the third inverter output has no effect on the output of the NAND gate 118, because the inverted pulse from the inverter 122 has already driven the NAND gate output high at approximately time $t_5$. By the time the inverted pulse applied to the NAND gate 118 ends at about time $t_8$, the output of the third inverter 116 has transitioned low. Therefore, the output of the NAND gate 118 does not transition low when the inverted pulse returns high.

Figure 6:
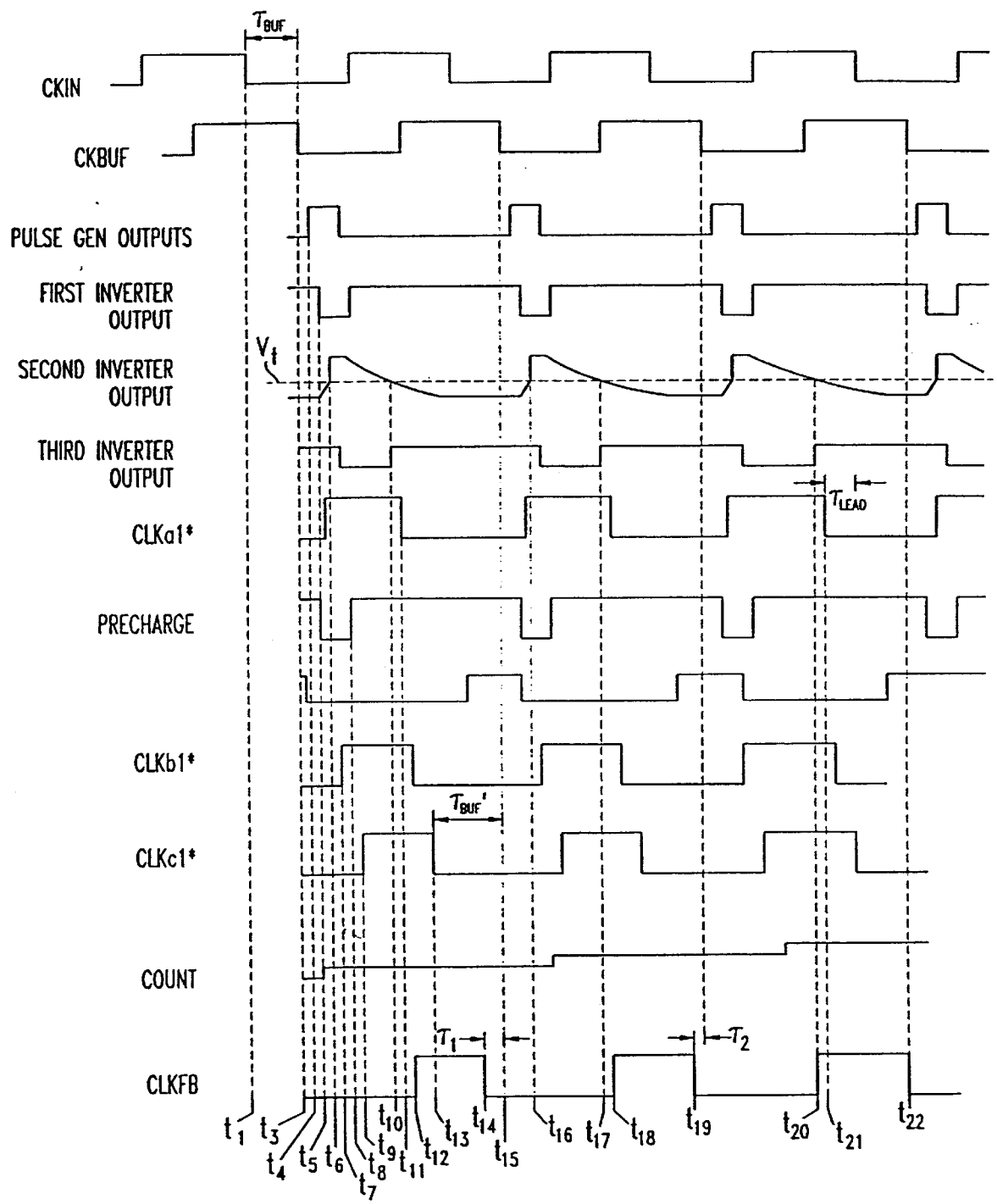
FIG. 6 is a signal timing diagram of selected signals within the delay-locked loop of FIG. 5.
Figure 7:
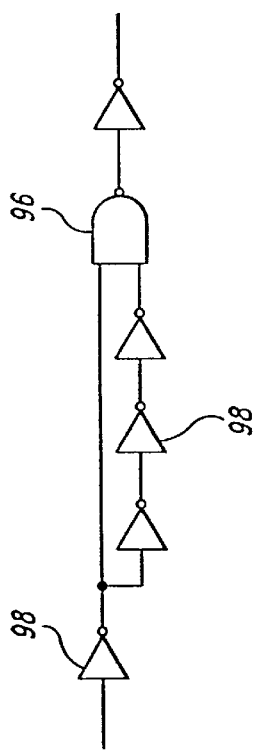
FIG. 7 is a schematic of a pulse generator in the delay-locked loop of FIG. 5.

The output of the NAND gate 118 forms the first delayed clock signal CLKa1*, as shown in the seventh graph of FIG. 6. Since the output of the NAND gate 118 is already driven high by the time the output of the inverter 116 goes low as described above, the leading edges of the first delayed clock signal CLKa1* are initiated by the inverted pulses from the inverter 122 and the pulses are sustained by the output of the third inverter 116.

The output of the NAND gate 118 also drives a delay block 124 formed from a NOR gate 126 and an inverter 127 that produces a first shifted delayed clock CLKb1*. However, the high-going transition of the delayed clock signal CLKa1* does not affect the first shifted delayed clock signal CLKb1*, because the NOR gate 126 has received the pulse from the pulse generator 120 and its output has already been driven low before the first delayed clock CLKaI* transitions high, as shown in the ninth graph of FIG. 6.

The output of the delay block 124 also drives a second delay block 130 to produce a second shifted delayed clock signal CLKc1* that is delayed slightly relative to the first shifted delayed clock signal CLKbI*, as shown in the tenth diagram of FIG. 6.

In addition to forming the second shifted delayed clock signal CLKc1*, the output of the second delay block 130 also drives a delay buffer 128 that has a delay substantially equal to the delay of the buffer amplifier 46 (FIG. 3). The delay buffer 128 produces a delayed feedback signal CLKFB that is delayed relative to the second shifted delayed clock signal CLKC1* by approximately the time delay of the buffer amplifier 46. The feedback clock signal CLKFB goes high at time $t_{12}$ in response to the transition of the second shifted delayed clock signal CLKc1* at time $t_9$.

Figure 8:
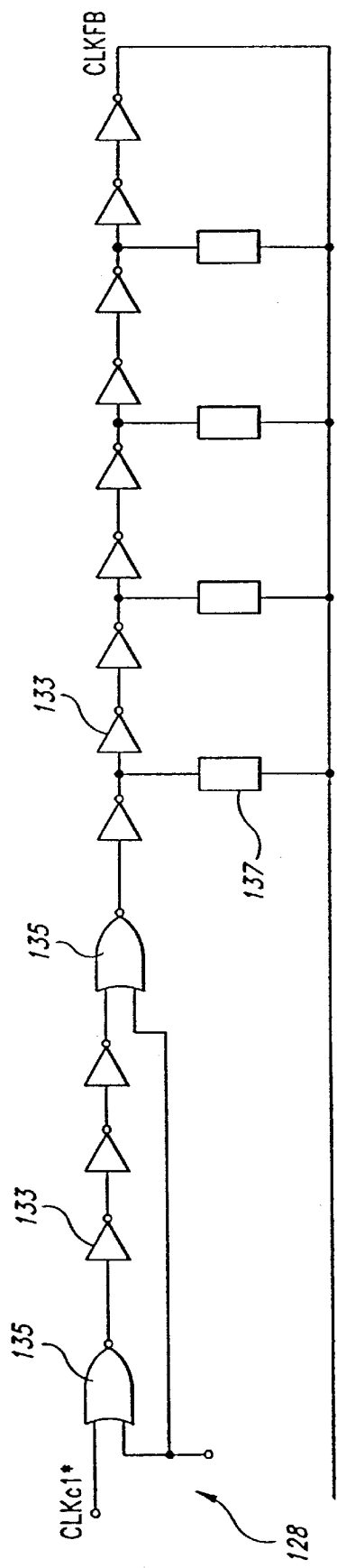
FIG. 8 is a schematic of a buffer model circuit in the delay-locked loop of FIG. 5.

As shown in FIG. 8, the delay buffer 128 is formed from a series of inverters 133 and NOR gates 135, where the second input of each NOR gate 135 is driven by the pulse generator 120. Each of the inverters 133 and NOR gates 135 delays the second shifted delayed clock signal CLKcl* by one gate delay.

The NOR gates 135 receive the reset pulse from the reset pulse generator 120 at their second inputs. Because the reset pulse bypasses the inverters 100, 102, 116, the NAND gate 118, and the delay blocks 124, 130, reset pulse reaches the NOR gates 135 prior to any transitions caused by the pulse from the pulse generator 94. The high going reset pulse therefore sets the outputs of the NOR gates 135 low and thus the feedback clock signal CLKFB high very shortly after the buffered clock signal CLKBUF transitions. The reset pulse prevents any transient signals from inadvertently causing a low going transition of the feedback clock signal CLKFB that would trigger the race detection circuit 90. One example of such an inadvertent low going transition may occur where the delay locked loop 86 is far from being locked. If the decaying output from the second inverter 102 is very slow, the input to the third inverter 116 may fall below its threshold voltage just as a subsequent falling edge of the buffered clock signal CLKBUF arrives at the pulse generator 94 and the race detection circuit 90. Before the pulse from the pulse generator 94 reaches the third inverter 116, the third inverter 116 outputs a high going transition in response to the decaying common node voltage. The high going transition from the third inverter 116 could cause a low going transition of the buffered clock signal CLKBUF if the reset NOR gates 135 did not ensure the buffered clock signal CLKBUF would remain high. Such an inadvertent low going pulse would trigger the race detection circuit and cause an improper incrementing or decrementing of the count signal COUNT.

To allow the delay of the delay buffer 128 to be tuned to the specific delay of the buffer amplifier 46, four tapping switches 137 are coupled between various tapping locations in the chain of inverters 133 and the output of the delay buffer 128. The tapping switches 137 are conventional programmable switches, such as antifises. When the switches are closed, they bypass one or more pairs of the inverters 133, thereby reducing the overall delay of the delay buffer 128.

Returning to FIGS. 5 and 6, the response of the variable delay line 86 to the falling edge of the pulse from the pulse generator 94 will now be described. When the pulse from the pulse generator 94 returns low at time $t_7$, the output of the first inverter 100 transitions high, as shown in the fourth graph of FIG. 6. The high output from the first inverter 100 turns OFF all of the PMOS transistors 108, thereby isolating the capacitors 110 from the supply voltage $V_{cc}$. Very shortly thereafter, at time $t_8$, the output of the second inverter 102 attempts to transition low in response to the high-going transition of the output from the first inverter 100. However, the output of the second inverter 102 does not transition low immediately because the voltage of the common node 114 is sustained by the capacitors 110 through the ON selection switches 112. Consequently, the output of the second inverter decays according to an RC time constant defined by the output resistance of the inverter 102 and the capacitance of the capacitors 110 coupled to the common node 114. Because the capacitance of the bank is controlled by the count signal COUNT, the count signal COUNT also defines the decay rate of the second inverter output. The initial value of the count signal COUNT and thus the initial decay rate may be selected based upon an anticipated average buffer delay time, or may simply begin at the lowest or highest value of the counter 92.

The output of the third inverter 116 transitions high at time $t_{10}$ when the voltage of the common node 114 decays to a threshold voltage $V_T$ of the third inverter 116, as shown in the fifth graph of FIG. 6. The time between the high-going transition at the input of the second inverter 102 and the low-going transition of the third inverter 116 is thus determined by the count signal COUNT, because the count signal COUNT controls the decay rate of the common node voltage, as described above.

By the time the third inverter output transitions high at time $t_{10}$, the precharge pulse from the inverter 122 has already returned high, as shown in the eighth graph of FIG. 6. Therefore, when the output of the third inverter 116 transitions high at time $t_{10}$, the output of the NAND gate 118 (CLKal*) transitions low at time $t_{11}$, which is delayed relative to time $t_{10}$ by the gate delay of the NAND gate 118. The falling edge of the first clock signal CLKa1* at time $t_{11}$ causes the first shifted delayed clock signal CLKb1* to transition low at time $t_{12}$ and the second shifted delayed clock signal CLKc1* to transition low at time $t_{13}$. The feedback clock signal CLKFB therefore transitions low at time $t_{14}$, which is delayed relative to the second-shifted delayed clock signal CLKc1* by the delay time $\tau_{BUF}$ of the delay buffer 128.

The feedback clock CLKFB and the buffered clock signal CLKBUF are input to first and second inputs of the race detection circuit 90. The race detection circuit 90 compares trailing edges of the clock signals CLKFB, CLKBUF to determine whether the feedback clock signal CLKFB leads, lags, or is substantially synchronized to the buffered clock signal CLKBUF.

If the feedback clock signal CLKFB leads the buffered clock signal CLKBUF by a delay time $\tau_1$, as shown in the lowermost graph of FIG. 6, the race detection circuit 90 outputs an active low UP* signal and a count pulse CPUL to the counter 92. In response to the active low UP* signal and the count pulse CPUL, the counter 92 increments the count signal COUNT, thereby incrementing the capacitance of the capacitor bank 106 as described above. The increased capacitance of the capacitor bank 106 increases the RC time constant to slow the decay rate of the next pulse output from the second inverter 102, as shown between times $t_{16}$ and $t_{17}$ in the fifth graph of FIG. 6.

The decreased decay rate of the second inverter output delays the low-going transition of the third inverter output until time $t_{17}$. Consequently, the first delayed clock signal CLKal* transitions low at time $t_{18}$ and the feedback clock signal CLKFB returns low at time $t_{19}$, which leads the buffered clock signal CLKBUF by a time delay $\tau_2$, as shown in the lowermost graph of FIG. 6. Because the high-to-low transition of the feedback clock signal CLKFB has been delayed due to the increased capacitance of the capacitor bank 106, the lead time $\tau_2$ of the feedback clock signal CLKFB relative to the buffered clock signal CLKBUF has been reduced relative to the original lead time $\tau_1$. However, the feedback clock signal CLKFB still leads the buffered clock signal CLKBUF. Therefore, the race detection circuit 90 outputs another active low UP* signal and count pulse CPUL to increment the counter 92 once again. The capacitance, and thus decay time of the second inverter output, is increased further to further delay the transition of the third inverter output until time $t_{20}$. The first delayed clock signal CLKal* therefore transitions low at time $t_{21}$ and the feedback clock signal CLKFB transitions low at time $t_{22}$.

At time $t_{22}$, the falling edge of the feedback clock signal CLKFB is synchronized with the falling edge of the buffered clock signal CLKBUF. As will be described below with reference to FIG. 9, the race detection circuit 90 does not output a count pulse CPUL and the counter 92 does not increment the count signal COUNT, because the delay-locked loop 76 is substantially synchronized.

One skilled in the art will recognize that, when the feedback clock signal CLKFB lags the buffered clock signal CLKBUF, the race detection circuit 90 can decrement the counter 92. The capacitance will thus decrease, thereby reducing the delay time of the variable delay line 86 until the clock signals CLKFB, CLKBUF are synchronized.

Figure 9:
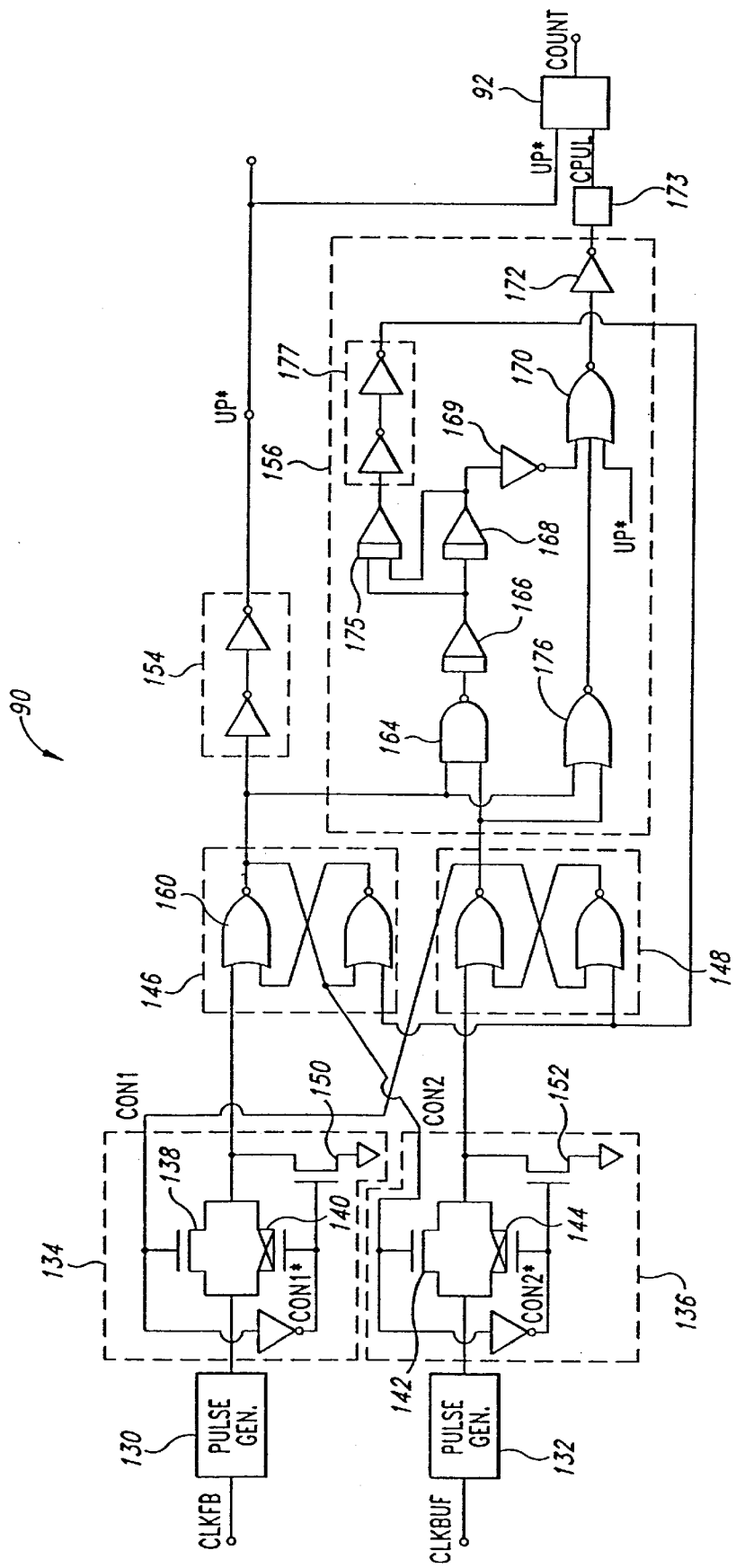
FIG. 9 is a schematic of a race detection circuit in the delay-locked loop of FIG. 5.

FIG. 9 shows one circuit realization of the race detection circuit 90. The race detection circuit 90 receives the feedback clock signal CLKFB at a first pulse generator 130 and the buffered clock signal CLKBUF at a second pulse generator 132. Each of the pulse generators 130, 132 is similar in structure to the pulse generator 94 of FIG. 7. Thus, the pulse generators 130, 132 produce short output pulses in response to falling edges of the clock signals CLKFB, CLKBUF, respectively.

The output pulses from the pulse generators 130, 132 are input to respective gating circuits 134, 136 that include pairs formed by complementary pairs of transistors 138, 140 and 142, 144. In the first gating circuit 134, the gate of the NMOS transistor 138 is controlled by a first control signal CON1 and the gate of the PMOS transistor 140 is controlled by an inverted version of the first control signal CON1*. When the first control signal CONI is high, both transistors 138, 140 are ON and the output of the pulse generator 130 is coupled to a first latch circuit 146.

When the first control signal CON1 is low, both transistors 138, 140 are OFF, thereby isolating the first latch circuit 146 from the first pulse generator 130. Additionally, the inverted first control signal CON1* turns ON a reference transistor 150, thereby grounding the input of the first latch circuit 146 whenever the transistors 138, 140 are OFF.

In the second gating circuit 136, the NMOS transistor 142 is controlled by a second control signal CON2 and the PMOS transistor 144 is controlled by an inverted second control signal CON2*. When the second control signal CON2 is high, the transistors 142, 144 are ON and the output of the second pulse generator 132 is coupled to a second latch circuit 148.

When the second control signal CON2 is low, the transistors 142, 144 are OFF, thereby isolating the second latch circuit 148 from the second pulse generator 132. Additionally, the inverted second control signal CON2* turns ON a second reference transistor 152 to ground the input of the second latch circuit 148.

The output of the first latch circuit 146 is buffered through a pair of inverters 154 to produce the UP* signal for the counter 92. Additionally, the outputs of both of the latch circuits 146, 148 are input to an arbitration circuit 156 that determines whether or not to produce the control pulse CPUL for the counter 92.

The operation of the race detection circuit 90 will now be explained for situations where the feedback clock signal CLKFB leads the buffered clock signal CLKBUF, where the feedback clock signal CLKFB lags the buffered clock signal CLKBUF, and where the feedback clock signal CLKFB is substantially synchronous with the buffered clock signal CLKBUF. Initially, both latch circuits 146, 148 output high signals CON1, CON2. Therefore, each gating circuit 134, 136 couples the output of its respective pulse generator 130, 132 to the input of its respective latch circuit 146, 148.

If the feedback clock signal CLKFB leads the buffered clock signal CLKBUF, the first pulse generator 130 outputs a high-going pulse prior to the second pulse generator 132. The pulse from the first pulse generator 130 passes directly through the gating circuit 134 to a first NOR gate 160 in the first latch circuit 146. In response to the high-going pulse, the first NOR gate 160 produces a low output that forms the second control signal CON2. The low second control signal CON2 turns OFF the transistors 142, 144, thereby isolating the pulse generator 132 from the second latch circuit 148. Consequently, when the second pulse generator 132 outputs its pulse, the pulse does not reach the second latch circuit 148. As a result, the output of the second latch circuit 148 remains high if the output of the first latch circuit 146 transitions low first.

The low transition of the first latch output passes through the buffer 154 to produce an active low UP* signal that is input to the counter 92. Additionally, the outputs of the latch circuits 146, 148 are applied to the arbitration circuit 156. Within the arbitration circuit 156, the low-going output of the first latch 146 causes a NAND gate 164 to output a high-going signal. Because both inputs to the NAND gate 164 were high previously, the low-going latch output causes the NAND gate output to transition high. The high output of the NAND gate 164 is delayed by a pair of delay circuits 166, 168 and then inverted at an inverter 169 to produce a delayed low-going signal. The delayed low-going signal is input to a three-input NOR gate 170 that receives the low UP* signal at a second input.

The third input to the three-input NOR gate 170 comes from a NOR gate 176 that is driven by the outputs of the latches 146, 148. Because the second latch output is high, the NOR gate 176 provides a low signal to the three-input NOR gate 170. Initially (i.e., before the high-going transition from the NAND gate 164 induces a low-going input to the three-input NOR gate 170), the inverter 169 supplies a high voltage to the three-input NOR gate 170 that keeps the output of the NOR gate 176 high. Consequently, the low signal from the NOR gate 176 does not affect the output of the three-input NOR gate 170.

When the delayed rising edge from the NAND gate 164 causes the inverter 169 to provide a low-going signal to the three-input NOR gate 170, all three inputs to the NOR gate 170 are low. In response, the output of the NOR gate 170 transitions high. The high transition is converted to a low transition by an inverter 172. The low-going transition is then applied to a pulse generator 173 that produces the count pulse CPUL. Thus, the race detection circuit 90 provides an active low UP* signal and the count pulse CPUL to the counter 92 in response to the feedback clock CLKFB leading the buffered clock signal CLKBUF, thereby incrementing the count signal COUNT. In addition to activating the three-input NOR gate 170, the high-going pulse from the NAND gate 164 is fed back through a delay circuit including a pulse generator 175 and buffer 177 to provide a reset pulse to reset the latch circuits 146, 148.

If the buffered clock signal CLKBUF leads the feedback clock signal CLKFB, the second pulse generator 132 outputs a pulse that passes through the second gating circuit 136 to drive the output of the second latch circuit 148 low. The output of the second latch circuit 148 forms the first control signal CON1. Therefore, the low-going output of the second latch 148 turns OFF the transistors 138, 140, thereby isolating the first pulse generator 130 from the first latch circuit 146. When the first pulse generator 130 outputs a pulse, the OFF transistors 138, 140 block the pulse from reaching the first latch circuit 146. The output of the first latch circuit 146 therefore remains high and the UP* signal remains inactive high.

The low-going transition from the second latch circuit 148 causes the output of the NAND gate 164 to transition high, thereby causing the inverter 172 to provide a low-going transition to the pulse generator 173. In response, the pulse generator 173 outputs the count pulse CPUL. Thus, in response to the feedback clock signal CLKFB lagging the buffered clock signal CLKBUF, the race detection circuit 90 outputs an inactive high UP* signal and a count pulse CPUL to the counter 92, thereby causing the counter 92 to decrement the count signal COUNT.

If the falling edges of the clock signals CLKBF, CLKBUF arrive substantially simultaneously, both pulse generators 130, 132 output pulses at approximately the same time. The pulses pass through the gating circuits 134, 136, thereby driving the outputs of both of the latch circuits 146, 148 low. Neither pulse is blocked because the pulses pass through the gating circuits 134, 136 before the control signals CON1, CON2 go low. The low output from the first latch circuit 146 causes the UP* signal to go active low. Additionally, the low outputs cause the NOR gate 176 in the arbitration circuit 156 to output a high signal to the three-input NOR gate 170. The output of the three-input NOR gate 170, which was already low due to the high output from the inverter 169, remains low.

The low outputs from the latch circuits 146, 148 also cause the output of the NAND gate 164 to go high. The high-going output of the NAND gate 164 is delayed by the delay circuits 166, 168 and inverted by the inverter 169 to produce a delayed, low-going transition to the three-input NOR gate 170. When the low-going signal from the inverter 169 reaches the three-input NOR gate 170, the high signal has no effect on the three-input NOR gate 170, because the NOR gate 176 has already pulled one input of the three-input NOR gate 170 high. Consequently, the output of the three-input NOR gate 170 does not transition high in response to the low-going transition from the inverter 169. The inverter 172 therefore does not output a low-going transition to the pulse generator 173, and the pulse generator 173 does not supply a count pulse CPUL to the counter 92. Thus, the count signal COUNT from the counter 92 is neither incremented nor decremented. In summary, when the feedback clock signal CLKFB and the buffered clock signal CLKBUF are substantially synchronized, the count signal COUNT remains constant and the delay of the delay line 86 remains unchanged.

Figure 10:
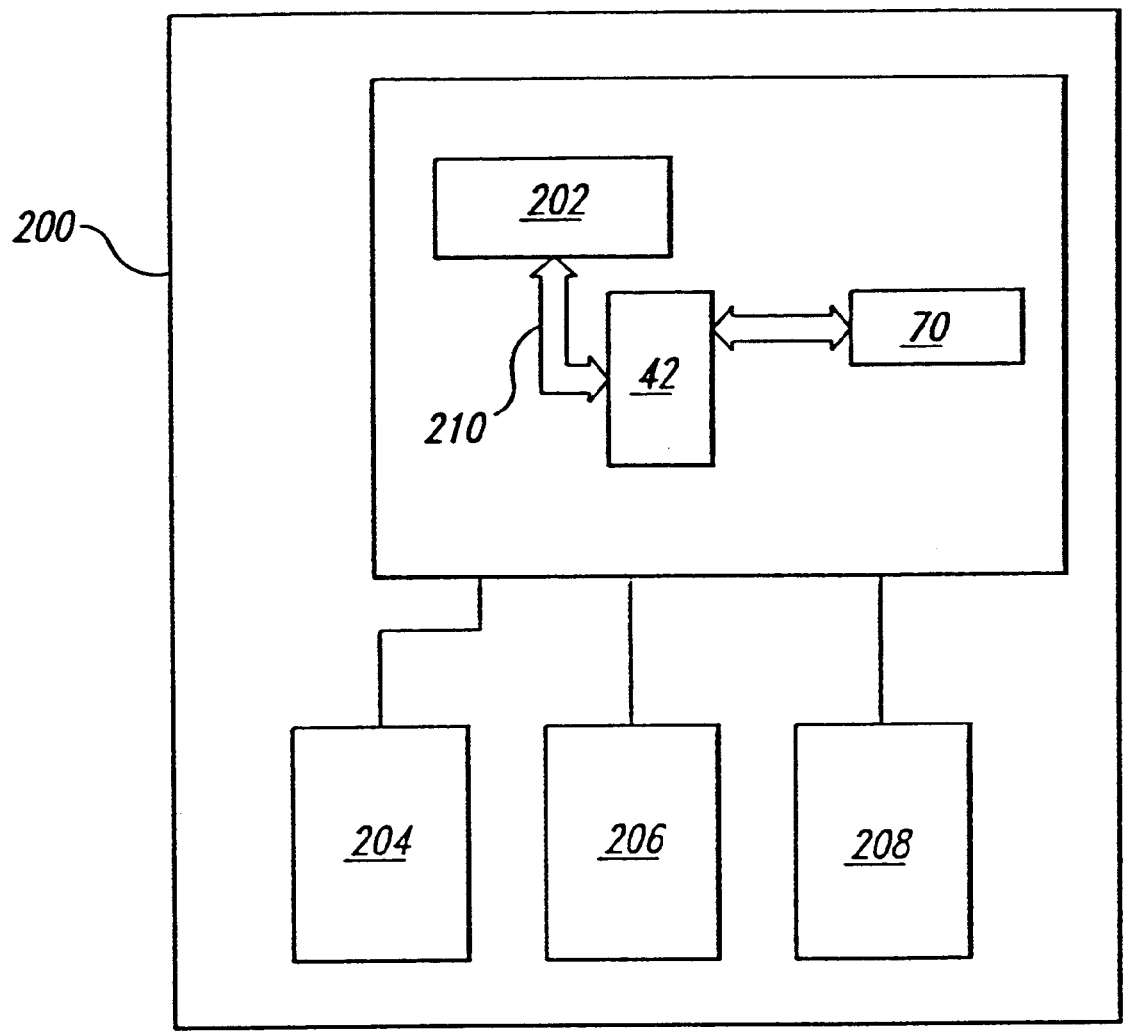
FIG. 10 is a block diagram of a computer system including the memory controller and memory device of FIG. 3.

FIG. 10 is a block diagram of a computer system 200 that contains the memory device 70 and memory controller 44 of FIG. 3. The computer system 200 includes a processor 202 for performing computer functions such as executing software to perform desired calculations and tasks. The processor 202 also includes command and data buses 210 to activate the memory controller 44. One or more input devices 204, such as a keypad or a mouse, are coupled to the processor 202 and allow an operator to manually input data thereto. One or more output devices 206 are coupled to the processor 202 to display or otherwise output data generated by the processor 202. Examples of output devices include a printer and a video display unil One or more data storage devices 208 are coupled to the processor to store data on or retrieve data from external storage media (not shown). Examples of storage devices 208 and storage media include drives that accept hard and floppy disks, tape cassettes and compact-disk read-only memories.

While the invention has been described herein by way of exemplary embodiments, various modifications may be made without departing from the spirit and scope of the invention. For example, although the delay-locked loop 76 has been described herein as being a clock source for a memory device 70, one skilled in the art will recognize that the delay-locked loop 76 may be useful in many applications, including controlling timing within the memory controller 44 or in any other application that utilizes a synchronized clock signal. Moreover, although the capacitor bank 106 is described herein as being coupled to a single node, it may be desirable in some applications to include more than one capacitor bank 106 or to couple the capacitors 110 at separate locations along the variable delay circuit 88. Further, a variety of logic structures may be employed for the various components, including the pulse generators 94, 120, 130, 132 and arbitration circuit 156. Additionally, the counter 92 is described herein as being incremented or decremented by one when the feedback clock signal CLKFB leads or lags the buffered clock signal CLKBUF. One skilled in the art will understand that the counter 92 may be incremented by values other than one and that the delay-locked loops 76, 78 may be locked more quickly if a more sophisticated algorithm is employed for incrementing or decrementing the counter 92. Accordingly, the invention is not limited except as by the appended claims.

What is claimed is:

1. A variable delay circuit for a delay-locked loop, comprising:
   an input terminal;
   an output terminal;
   a reference terminal;
   a first buffer having a first input coupled to the input terminal and a first buffer output;
   a second buffer having a second input coupled to the first buffer output, and a second buffer output coupled to the output terminal;
   a first capacitor coupled between the first buffer output and the reference terminal;
   a second capacitor;
   a first isolation switch serially coupled with the second capacitor between the first buffer output and the reference terminal, the first isolation switch having a first switching input and being responsive to a selection signal at the first switching input to selectively couple the second capacitor between the first buffer output and the reference terminal; and
   a model circuit serially coupled with the first and second buffers having a model circuit delay corresponding to the delay of an input signal.

2. The variable delay circuit of claim 1 wherein the model circuit comprises:
   a serially connected chain of delay elements, serially coupled to the first and second buffers; and
   a programmable bypass circuit selectively programmable to bypass at least one of the delay elements.

3. The variable delay circuit of claim 1, further comprising a precharging circuit coupled to the input terminal and responsive to a clock signal at the first input to precharge the first capacitor.

4. The variable delay circuit of claim 3, further comprising:
- a discharging circuit coupled to the precharging circuit and configured to controllably discharge the first capacitor;
- a voltage detector having a detect input terminal coupled to the first capacitor and a detector output terminal, the voltage detector being operative to produce a delayed intermediate signal when the capacitor voltage discharge below a selected threshold voltage; and
- an output stage having an input terminal coupled to the detector output terminal and responsive to produce the delayed signal in response to the intermediate signal.

5. A variable delay circuit for a delay-locked loop, comprising:
- an input terminal;
- an output terminal;
- a reference terminal;
- a first buffer having a first input coupled to the input terminal and a first buffer output;
- a second buffer having a second input coupled to the first buffer output, and a second buffer output coupled to the output terminal;
- a plurality of capacitors; and
- a plurality of switches each serially coupled with a respective one of the capacitors between the first buffer output and the reference terminal, each of the switches having a switch input and being responsive to a respective selection signal at the switching input to selectively couple the capacitor between the first buffer output and the reference terminal, the capacitors having capacitance values that vary from each other by multiples of two;
- a model circuit serially coupled with the first and second buffers having a model circuit delay corresponding to the delay of an input signal.

6. The variable delay circuit of claim 5, further comprising a model circuit serially coupled with the first and second buffers having a model circuit delay corresponding to the delay of the input signal.

7. The variable delay circuit of claim 6 wherein the model circuit comprises:
- a serially connected chain of delay elements, serially coupled to the first and second buffers; and
- a programmable bypass circuit selectively programmable to bypass one or more of the delay elements.

8. The variable delay circuit of claim 5, further comprising a precharging circuit coupled to the input terminal and responsive to a clock signal at the first input to precharge the first capacitor.

9. The variable delay circuit of claim 8, further comprising:
- a discharging circuit coupled to the precharging circuit and configured to controllably discharge the first capacitor;
- a voltage detector having a detect input terminal coupled to the first capacitor and a detector output terminal, the voltage detector being operative to produce a delayed intermediate signal when the capacitor voltage discharges below a selected threshold voltage; and
- an output stage having an input terminal coupled to the detector output terminal and responsive to produce the delayed signal in response to the intermediate signal.

10. A variable delay circuit for a delay-locked loop, comprising:
- an input terminal;
- an output terminal;
- a reference terminal;
- a first buffer having a first input coupled to the input terminal and a first buffer output;
- a second buffer having a second input coupled to the first buffer output, and a second buffer output coupled to the output terminal;
- N capacitors; and
- N switches each serially coupled with a corresponding one of the N capacitors between the first buffer output and the reference terminal, each of the switches having a switching input and being responsive to a respective selection signal at the switching input to selectively couple the capacitor between the first buffer output and the reference terminal, the capacitors collectively having capacitance values of $2^N, 2^{N-1}, 2^{N-2} \ldots 2^1, 2^0$.

11. The variable delay circuit of claim 10, further comprising a model circuit serially coupled with the first and second buffers having a model circuit delay corresponding to the delay of an input signal.

12. The variable delay circuit of claim 11 wherein the model circuit comprises:
- a serially connected chain of delay elements, serially coupled to the first and second buffers; and
- a programmable bypass circuit selectively programmable to bypass one or more of the delay elements.

13. The variable delay circuit of claim 10, further comprising a precharging circuit coupled to the input terminal and responsive to a clock signal at the first input to precharge the first capacitor.

14. The variable delay circuit of claim 13, further comprising:
- a discharging circuit coupled to the precharging circuit and configured to controllably discharge the first capacitor;
- a voltage detector having a detect input terminal coupled to the first capacitor and a detector output terminal, the voltage detector being operative to produce a delayed intermediate signal when the capacitor voltage discharges below a selected threshold voltage; and
- an output stage having an input terminal coupled to the detector output terminal and responsive to produce the delayed signal in response to the intermediate signal.

* * * * *